United States Patent
Chen

(10) Patent No.: US 7,843,672 B2
(45) Date of Patent: Nov. 30, 2010

(54) INPUT/OUTPUT REGULATING CIRCUITRY WITH SELF-ELECTROSTATIC-DISCHARGE PROTECTION

(75) Inventor: Te-Wei Chen, Chu-Pei (TW)

(73) Assignee: Silicon Motion, Inc., Jhubei (TW)

( * ) Notice: Subject to any disclaimer, the term of this patent is extended or adjusted under 35 U.S.C. 154(b) by 278 days.

(21) Appl. No.: 12/038,042

(22) Filed: Feb. 27, 2008

(65) Prior Publication Data

US 2008/0315854 A1 Dec. 25, 2008

Related U.S. Application Data

(60) Provisional application No. 60/945,681, filed on Jun. 22, 2007.

(51) Int. Cl.
*H02H 9/00* (2006.01)
*H02H 3/00* (2006.01)
*H02H 7/00* (2006.01)

(52) U.S. Cl. .............................. 361/55; 361/54; 361/56; 361/91.5

(58) Field of Classification Search ................... 361/55, 361/54, 56, 91.5
See application file for complete search history.

(56) References Cited

U.S. PATENT DOCUMENTS

| | | | | |
|---|---|---|---|---|
| 6,282,145 B1 * | 8/2001 | Tran et al. | ............... | 365/230.06 |
| 6,751,118 B2 * | 6/2004 | Tran et al. | ............... | 365/185.03 |
| 6,956,779 B2 * | 10/2005 | Tran | ............... | 365/205 |

* cited by examiner

*Primary Examiner*—Bao Q. Vu
(74) *Attorney, Agent, or Firm*—Grossman, Tucker, Perreault & Pfleger, PLLC

(57) ABSTRACT

An I/O regulating circuitry is provided. The I/O regulating circuitry omits the ESD device in a CMOS process with a minimized critical dimension to reduce chip size while still maintaining electrostatic discharge immunity. The I/O regulating circuitry is applied in MLC flash memory applications and the flash controller thereof.

6 Claims, 3 Drawing Sheets

INPUT/OUTPUT REGULATING CIRCUITRY WITH SELF-ELECTROSTATIC-DISCHARGE PROTECTION

This application claims the benefit of priority based on U.S. Provisional Application No. 60/945,681 filed on Jun. 22, 2007.

CROSS-REFERENCES TO RELATED APPLICATIONS

Not applicable.

BACKGROUND OF THE INVENTION

1. Field of the Invention

The present invention relates to an Input/Output (I/O) regulating circuitry. More particularly, the present invention relates to an I/O regulating circuitry without an ESD device and with self-electrostatic-discharge protection.

2. Descriptions of the Related Art

Generally, to prevent electrostatic discharge damage, an ESD device is designed for connection to an I/O chip pad. When electrostatic discharge occurs, the ESD device absorbs the electrostatic discharge energy to protect the circuitries of the chip.

However, as the critical dimensions of CMOS process shrink, the ESD device has a poor breakdown voltage; that is, the junction breakdown voltage decreases. Therefore, the significant voltage variation of the internal circuitries of the chip may damage the ESD device over time and result in an IC chip failure. For example, in multi-level cell (MLC) technology, the voltage variation of its significant equivalent load would result in a significant energy change. The changed energy then has a great possibility of damaging the ESD device.

Consequently, it is important to effectively protect the chip under significant voltage variations and saving the equivalent ESD area in CMOS processes with a minimized critical dimension.

SUMMARY OF THE INVENTION

One objective of this invention is to provide an I/O regulating circuitry in a chip. The I/O regulating circuitry omits an ESD device with self ESD protection to improve the immunity against significant voltage variation. The I/O regulating circuitry is manufactured by a CMOS process.

Because voltage variations take up essential time when it happens, the changing energy damages the ESD device. Therefore, omitting the ESD device can improve the aforementioned immunity and prevent unnecessary current leakages and heat damage. The I/O regulating circuitry comprises a regulator and an I/O pad. The regulator is connected to an external load of the chip and provides the first voltage supply to the chip. The I/O pad is also connected to the regulator. The regulator receives an external power supply via the I/O pad.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the descriptions that follow, the present invention will be described in reference to embodiments of regulating circuitry with self-ESD protection connected to an I/O pad. However, embodiments of the invention are not limited to any particular environment, application, or implementation. Therefore, the descriptions of the embodiments that follow are for illustration and not for limitation.

Figure 1:
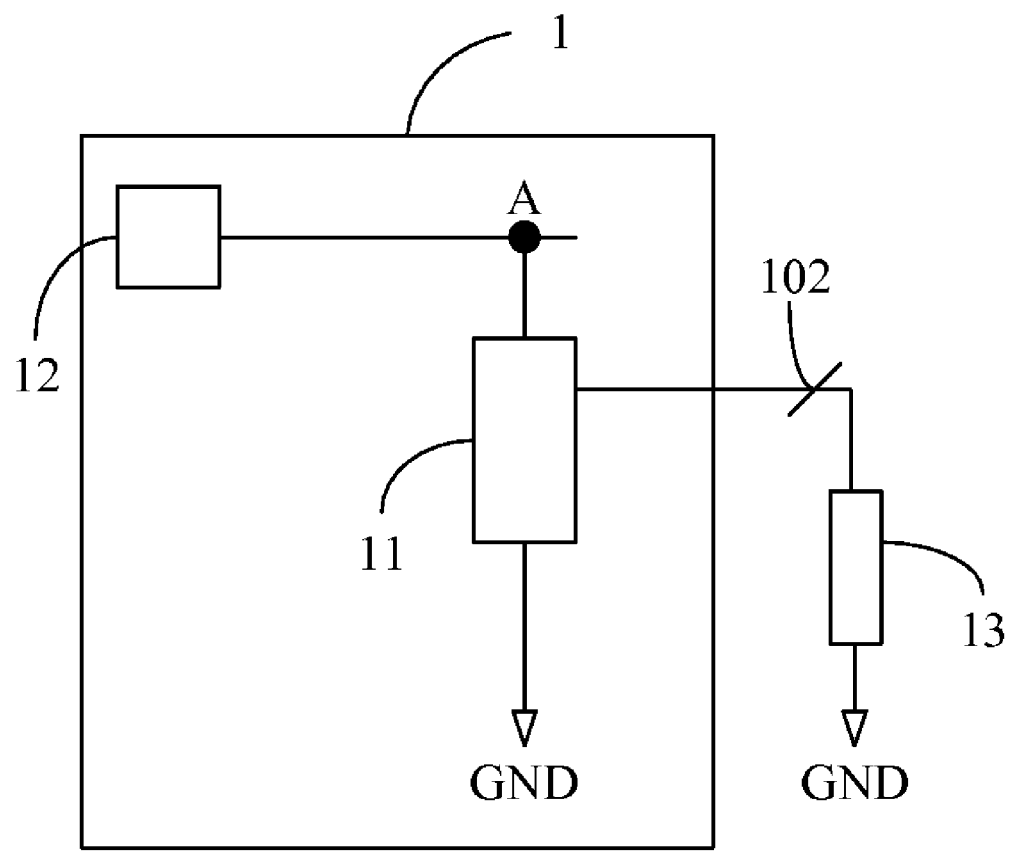
FIG. 1 illustrates the preferred embodiment of the present invention.

FIG. 1 illustrates the preferred embodiment of an I/O regulating circuitry 1. The I/O regulating circuitry 1 is placed in a chip manufactured by a CMOS process with a minimized critical dimension. The minimized critical dimension is not greater than 0.18 micrometer (μm), for example a 0.18 μm CMOS process, a 0.09 μm CMOS process, etc. The I/O regulating circuitry comprises a regulator 11 and an I/O pad 12. The regulator 11 is connected to a load 13 of the chip and provides a first voltage supply 102 to the chip as a working voltage. The I/O pad 12 is connected to the regulator 11 and receives an external power supply. The illustration of the load 13 is shown in FIG. 2a and FIG. 2b.

Figure 2A:
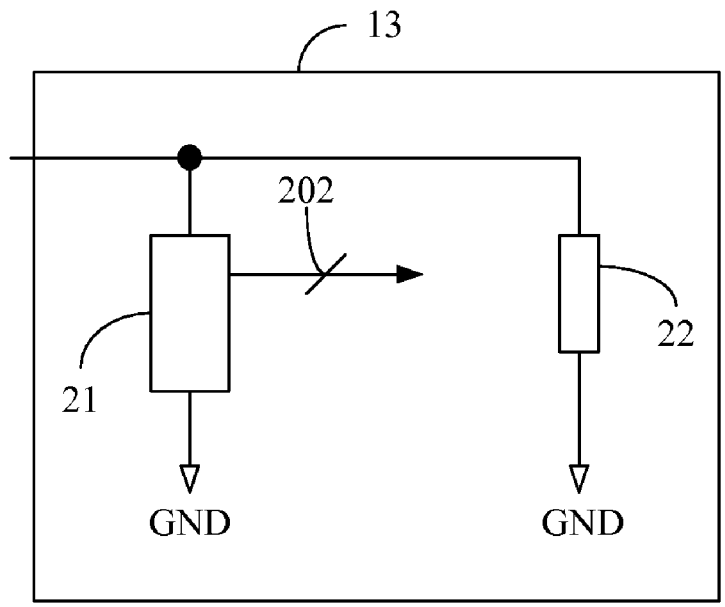
FIG. 2a illustrates the external load of the preferred embodiment.

FIG. 2a illustrates the case that the load 13 is an external load. In this case, when the I/O regulating circuitry 1 is applied in a MLC flash memory and is manufactured by a 0.18 μm CMOS process, the MLC flash memory may be manufactured by a 70 nanometer (nm) process.

Figure 2B:
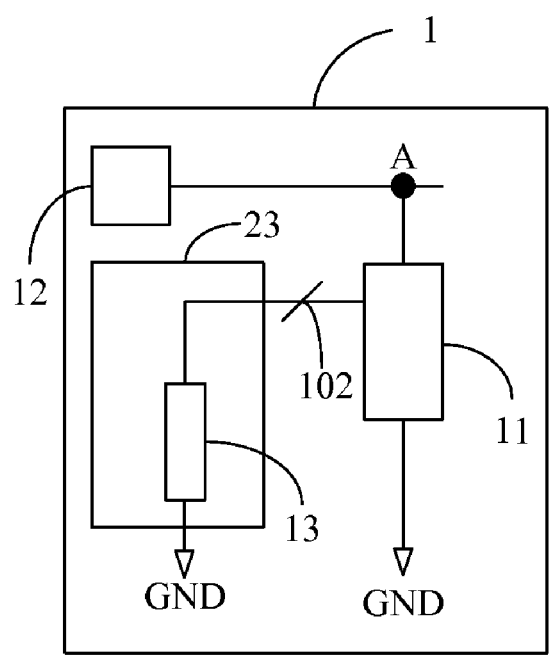
FIG. 2b illustrates the internal load of the preferred embodiment.

FIG. 2b illustrates the case that the load 13 is an internal load. In this case, the load 13 is a MLC flash memory embedded in a flash controller 23.

The load 13 is equivalent to a load representing the entire internal circuitry connected to the output of the regulator 11. In this case, the load 13 comprises a flash memory. The regulator 11 provides the first voltage supply 102 to the load 13. Generally, the first voltage supply 102 is a constant direct current (DC) voltage supplying with a first DC voltage level. The first DC voltage level is designed to be stable. The regulator 11 receives the external power supply via the I/O pad 12. In this embodiment, the external power supply is a constant DC voltage supply.

The I/O regulating circuitry 1 needs no additional ESD device. Detailed description is as follows. When the load changes, a transient voltage ($\Delta V$), as well as a significant transient current variance ($\Delta I$), occurs at node A. Roughly, $\Delta V$ is related to $\Delta I$ and can be expressed in the following equation:

$$\Delta V = ESR \times \Delta I + L \frac{di}{dt}$$

wherein "ESR" represents an equivalent series resistor (ESR), and "L" represents the inductance of an equivalent series inductor (ESL). Both the ESR and ESL naturally exist in the circuitry. However, the $\Delta V$ may be large and thus, if there were an ESD device in the I/O regulating circuitry, damage the ESD device. Once the ESD device is damaged, the chip may have current leakage and heat damage.

For example, the I/O regulating circuitry 1 made by 0.18 μm CMOS process, according to the design rule of the 0.18

μm CMOS process, can only support devices with working voltages of 1.8V or 3.3V, denoted as 0.18 μm/1.8V or 0.18 μm/3.3V. This is because the thickness of gate oxide cannot be modified by a designer except by the process provider. When the 0.18 μm CMOS process is applied in designing the ESD device, the ESD device can only bear a breakdown voltage of 7~9V.

The regulator 11 is supplied by a constant DC voltage of 5V. Using the equation for ΔV of a flash memory storage device, $$\Delta V = ESR \times \Delta I + L\frac{di}{dt},$$

it is fairly assumed that the ESR is 4 ohms, ΔI is 400 mA for 70 nm or beyond process, in the MLC flash memory application, L is 10 n Henry, and dt is 5 n seconds. The ΔV would then be estimated as:

$\Delta V = 4 \times 0.4 + 10n \times 0.4/5n = 1.6 + 0.8 = 2.4 V.$

Figure 3:
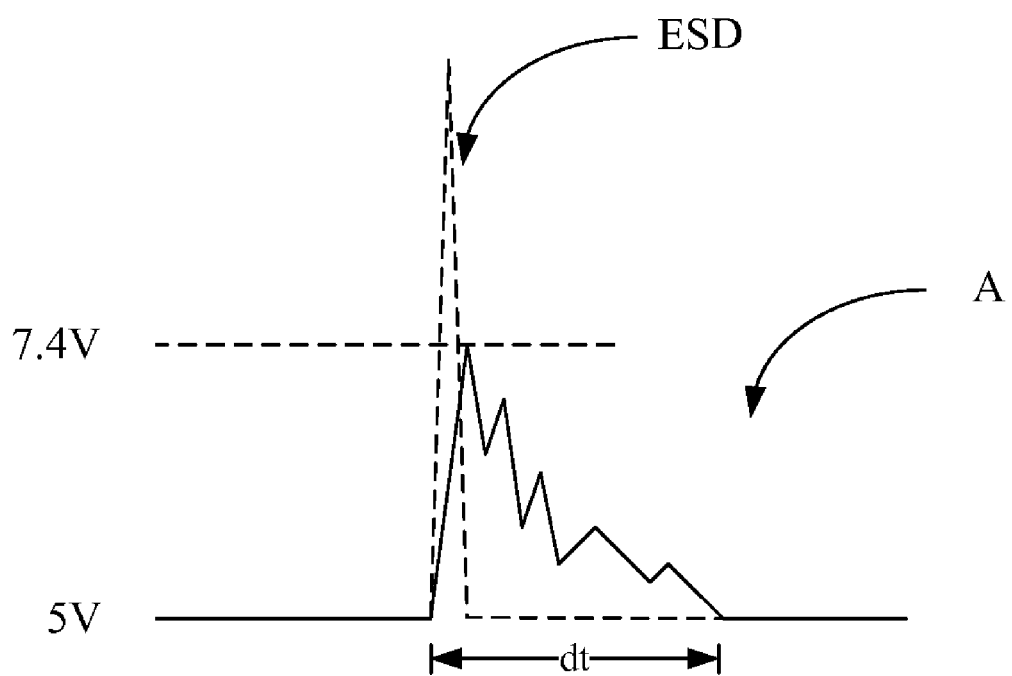
FIG. 3 illustrates a waveform at node A (shown in FIG. 1.).

A 2.4 V change would induce an inrushing shot at node A, as shown in FIG. 3, wherein the peak value is about 2.4V+ 5V=7.4V.

The peak value may overcome the breakdown voltage of the ESD device designed by the 0.18 μm CMOS process and thus damage the ESD device once the ESD device is designed to be connected to node A. Therefore, the ESD device is not necessary in situations where a high power supply is combined with high current variation, like the MLC flash cell application. Furthermore, the preferred embodiment omits the ESD device, and thereby reduces the chip size. The regulator 11 can somewhat resist the electrostatic discharge with its natural capability since every semiconductor device has a breakdown voltage. Thus, the I/O regulating circuitry 1 can perform electrostatic discharge immunity without an additional ESD device and prevent drawbacks of damaged ESD device such as leakage current and heat damage.

In the MLC case, the equivalent load is large as compared to a SLC (Single Level Cell) flash memory and comprises a significant equivalent capacitor, in which makes the dt and changed energy is essential during voltage variation. On the other hand, time duration of an ESD phenomenon is relatively short. FIG. 3 shows that the time duration of an ESD phenomenon is dramatically less than the dt of the voltage variation. If there were an ESD device in the I/O regulating circuitry 1, the changed energy would damage the ESD device.

FIG. 2a illustrates an embodiment of the load 13 that comprises a sub-regulator 21 and a load 22. The sub-regulator 21 is configured to provide a second voltage supply 202. Generally, the second voltage supply 202 is also a constant DC voltage supply with a second DC voltage level. For example, in an I/O regulating circuitry 1 made by the 0.18 μm CMOS process, the first voltage supply 102 (illustrated in FIG. 1) has a first DC voltage level of 3.3V. The second voltage supply 202 has a second DC voltage level of 1.8V. The first DC voltage level is larger than the second DC voltage level.

Another preferred embodiment is designed for more advanced CMOS process, which means the critical dimension is less than 0.18 μm. The ESD device designed by the advanced CMOS process can bear less breakdown voltage than the aforementioned embodiment. For example, the breakdown voltage for 0.13 um CMOS process is 5~7 volt. Thus, the preferred embodiment here also omits the ESD device and thereby, reduces chip size.

The present invention provides an I/O regulator circuitry without an ESD device with self ESD protection in a CMOS process with a minimized critical dimension. The I/O regulator circuitry can reduce chip size due to the omission of the ESD device. Furthermore, the electrostatic discharge immunity of the regular circuitry is still maintained. When voltage variation occurs in a chip with an essential load, the present invention can improve immunity against significant voltage variation.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above description, they have substantially been covered in the following claims as appended.

What is claimed is:

1. An Input/Output (I/O) regulating circuitry being placed in a chip manufactured by a CMOS process, the I/O regulating circuitry comprising:
   a regulator, being configured to be electrically connected to an load of the chip and provide a first voltage supply having a first DC voltage level to the chip; and
   an I/O pad, being configured to be electrically connected to the regulator;
      wherein the regulator receives an external power supply via the I/O pad, the regulator is directly electrically connected to a sub-regulator, the sub-regulator is sited in the chip and is configured to provide a second voltage supply having a second DC voltage level to the chip, the first DC voltage level is greater than the second DC voltage level.

2. The I/O regulating circuitry as claimed in claim 1, wherein the regulator receives a constant direct current (DC) voltage as the external power supply via the I/O pad.

3. The I/O regulating circuitry as claimed in claim 1, wherein the load is a flash memory.

4. The I/O regulating circuitry as claimed in claim 1, wherein the load is a MLC flash memory.

5. The I/O regulating circuitry as claimed in claim 4, wherein the MLC flash memory is manufactured with a minimized critical dimension not greater than 70 nanometer.

6. The I/O regulating circuitry as claimed in claim 1, wherein the chip manufactured by the CMOS process is manufactured with a minimized critical dimension not greater than 0.18 micrometer.

* * * * *